United States Patent [19]

Reif et al.

[11] Patent Number: 4,773,355
[45] Date of Patent: Sep. 27, 1988

[54] GROWTH OF EPITAXIAL FILMS BY CHEMICAL VAPOR DEPOSITION

[75] Inventors: L. Rafael Reif, Newton; Clifton G. Fonstad, Jr., Arlington, both of Mass.

[73] Assignee: Massachusetts Institute of Technology, Cambridge, Mass.

[21] Appl. No.: 939,533

[22] Filed: Dec. 9, 1986

Related U.S. Application Data

[62] Division of Ser. No. 742,930, Jun. 10, 1985, Pat. No. 4,659,401.

[51] Int. Cl.⁴ ............................................. C23C 16/50
[52] U.S. Cl. .................................... 118/719; 118/723; 118/725
[58] Field of Search ................ 118/723, 725, 715, 719

[56] References Cited

U.S. PATENT DOCUMENTS

| | | | |
|---|---|---|---|
| 3,306,768 | 2/1967 | Peterson | 427/255.3 |
| 4,131,659 | 12/1978 | Authier | 264/25 |
| 4,389,970 | 6/1983 | Edgerton | 118/666 |
| 4,524,719 | 6/1985 | Campbell | 118/725 |

OTHER PUBLICATIONS

Brodsky, IBM Tech. Dis. Bul., vol. 22, No. 8A, 1980.

*Primary Examiner*—Richard Bueker
*Attorney, Agent, or Firm*—Hamilton, Brook, Smith & Reynolds

[57] ABSTRACT

A method and apparatus for forming epitaxial thin film layers on substrates having abrupt transitions between layers of different composition or layers of different or like composition with different degrees of doping included therein. Gaseous reactants containing the desired elements to be included in the first film layer are injected into a CVD reaction chamber containing a substrate. The substrate is heated to a temperature high enough to obtain an epitaxial deposit, but low enough so as not to cause decomposition of the reactants. Once the gaseous reactant flows reach steady-state, an electric discharge or plasma is created in the gases to initiate the decomposition reaction and obtain a deposit. In this way, no transient effects are present. Once the deposit has attained sufficient thickness, the electric discharge is turned off to abruptly terminate deposition. phase composition is then established for the next film to be deposited before again generating plasma in the gas reactants to deposit an epitaxial film of different composition or different degree of doping on top of the previous one.

10 Claims, 2 Drawing Sheets

GROWTH OF EPITAXIAL FILMS BY CHEMICAL VAPOR DEPOSITION

This application is a division of application Ser. No. 742,930, filed June 10, 1985 now U.S. Pat. No. 4,659,401.

TECHNICAL FIELD

The present invention relates to growth of epitaxial films.

BACKGROUND ART

Epitaxy is the process of forming a single-crystalline film of material on a substrate or wafer. Generally the crystal structure or orientation of the film is the same as that of the substrate; however, the concentration and/or type of intentionally introduced impurities is usually different in the film than in the substrate. This characteristic of epitaxial films makes it possible to manufacture certain types of electronic devices, most notably integrated circuits such as Bipolar I$^2$L and Complementary Metal Oxide Semiconductor (CMOS) and VMOS transistor and logic circuits and discrete devices, such as Laser Diodes and High Electron Mobility Transistors.

Epitaxial films are currently commercially made by a number of techniques. The most common processes are Chemical Vapor Deposition (CVD), Physical Vapor Deposition (PVD)and Liquid Phase Epitaxy (LPE). Epitaxial growth by CVD is accomplished with reactants in the vapor phase (VPE). In CVD, gaseous molecule reactants are introduced into a reactor and undergo a chemical reaction. For example, the reactant $SiH_4$ decomposes into a silicon atom which is adsorbed on the surface and two $H_2$ molecules which subsequently desorb or leave the surface. The adsorbed silicon atom, although bound to the surface, can move around on the surface before becoming chemically bonded to the substrate. In epitaxial growth, the atom reaches an energetically favorable location on the surface where it can become incorporated into the crystal lattice thereby extending the substrate crystal structure into the growing Si film.

CVD is normally accomplished at reactor pressures ranging from $10^{-3}$ Torr to atmospheric pressure (760 Torr). This aspect of CVD, along with the chemical nature of the process, makes it possible to deposit uniform, conformal (i.e., good side wall and step coverage) epitaxial films on many wafers at a time.

An example of PVD is molecular beam epitaxy (MBE). In an MBE process, sources containing atoms of the material to be deposited are introduced into an ultra-high vacuum chamber at pressures typically less than $10^{-7}$ Torr. The solid sources are heated until vaporized. At these low pressures, the atoms in the vapor move with few, if any, gas phase collisions and deposit on any substrate surface they reach. When these atoms land on a hot wafer substrate surface, they behave similar to the adsorbed atoms in a CVD reactor behave and form an epitaxial film.

One advantage of physical vapor deposition (PVD) is that the ultra-high vacuum provides a clean environment for the deposition. Another advantage is that by using a mechanical shutter between the solid sources and the deposition surface very abrupt transitions can be obtained between multi-layered films of different compositions and/or doping levels. The shutter is closed until a steady-state beam of vapor is obtained from heating the solid sources. At this point the shutter is opened and deposition begins. Successive layers of films can be formed in this fashion.

The disadvantage of PVD is that conformal coverage cannot be attained due to the line-of-sight path taken by the depositing atoms, that is, shadowing effects occur. This property makes it difficult to deposit a film on more than a few wafers at a time. Furthermore, the ultra-high vacuum is expensive and difficult to maintain, thereby further reducing the efficiency and throughput of the process. With PVD, however, it is possible to deposit unique combinations of materials that cannot be deposited with CVD. PVD is thus used principally for fabricating heterojunction devices.

Conventional thermally driven CVD processes do not permit the introduction of a physical shutter system. In conventional CVD, gaseous reactants containing the elements to be deposited are injected into a chamber that contains a substrate heated to a predetermined temperature. Once the reactants are close to the substrate, they decompose, because of thermal energy, yielding the elements that form the deposit. Thermally-driven CVD is thus not capable of producing very abrupt interfaces, because of "memory" transient effects associated with the gas flow dynamics of thermally driven VPE systems.

Abrupt interfaces are desirable to be able to form layers of very thin films of material of different composition or to form narrow junctions between thin films of like composition but different degrees of doping.

Accordingly, a need exists for an epitaxial deposition process which can produce abrupt transitions between epitaxial layers of different composition or layers of like composition with different degrees of doping, but which does not require the ultra-high vacuum employed in MBE and does not incur the conformal coating difficulties associated with PVD.

The above-enumerated problems attendant to fabrication of thin films of different compositional characteristics with abrupt interfaces or thin films of like composition but different degrees of doping with abrupt junctions applies to films of elemental semiconductor material, such as Si films, or compound films, such as GaAs films, or combinations thereof.

A particular series of films, i.e., Metal Organic (MO) epitaxial films of III-IV semiconductors present an even more difficult processing problem. The wide range of compositions required, such as, AlGaAs for electrical devices and InGaAsP for optical devices, demands a crystal growth process capable of growing any combination of Al, Ga, In, As and P containing compounds. The use of these materials in optical, as well as electrical, devices requires the epilayers to have a high radiative recombination efficiency, as well as a high carrier mobility. It is also necessary that the technique provide excellent control over the thickness, uniformity, and compositions of the epilayers and over the abruptness of the interfaces between epilayers.

While LPE is capable of growing epilayers with high radiation recombination efficiency; very thin layers (less than 1000A) are difficult to produce and layer uniformity is difficult to control. Complex multiple layer heterostructures and graded composition epilayers are impractical to produce by LPE.

The epilayer composition and growth rate is controlled by the equilibrium which is established between the elemental sources and the vapor. This means that very close control of source and substrate temperatures is required for reproducible results and this is difficult to do in practice. The problems are particularly difficult with the Al source, the result being that conventional VPE is not capable of producing the important AlGaAs ternary.

Epitaxial films of Al containing compounds have been grown by MBE. Furthermore, MBE is capable of producing extremely abrupt interfaces and providing excellent control over layer thickness and uniformity. However, as previously noted, MBE suffers from several drawbacks, i.e., the necessity for ultrahigh vacuum resulting in high maintenance costs, low through-put, and conformal coating problems, making it unattractive for volume production. It is also difficult to grow phosphorous containing compounds by MBE.

Accordingly, a particular need exists for a process of producing metal organic thin film layers of III-IV compounds with abrupt change of compositional characteristics which operates at low pressures (0.1 to 5 Torr) rather than high vacuums ($10^{-8}$ to $10^{-5}$ Torr) and wherein the layers have good optical and/or electrical properties.

DISCLOSURE OF THE INVENTION

The invention comprises a method and apparatus for depositing a series of very thin epitaxial layers, having abrupt transitions, of controlled composition on a substrate utilizing a plasma enhanced CVD process (PECVD) in a reaction chamber with low pressures of about $10^{-2}$ to 1 Torr. In the apparatus of the present invention the presence and absence of an electric discharge (plasma) in the CVD reaction chamber causes an effect similar to the shutter operation in the MBE process.

More specifically, the general process is as follows:

First, the gaseous reactants containing the desired elements for the first film to be deposited on the substrate are injected into a reaction chamber containing the substrate. The substrate is then heated to a temperature high enough to obtain an epitaxial deposit, but low enough so as not to cause decomposition of the reactants. Once the gaseous reactant flows reach steady-state, an electric discharge is created in the gases to initiate the decomposition reaction and obtain a deposit. In this way, no transient effects are present. Once the deposit has attained sufficient thickness the electric discharge is turned off to abruptly terminate deposition. A new gas-phase composition is then established for the next film to be deposited before again generating plasma in the gas reactants to deposit an epitaxial film of different composition or different degree of doping on top of the previous one.

The plasma provides energetic electrons which break the reactants into highly reactive radicals. This reduces the deposition temperature because the reactants are partially disassociated before reaching the substrate. In the case of compound film formation, such as in metal organic film formation, the plasma also provides an improvement in control over the film composition and doping because the incorporation coefficients of the radicals are higher than those of the corresponding molecule. Abrupt junctions result from the low deposition temperatures which reduce solid state diffusion at the interface and the low reactor pressures which reduce reactant memory effects.

In addition to the plasma shutter innovation, the reactor employs an optical heating system which allows the substrate to be heated directly. This minimizes the heat capacity of the heated reactor parts by eliminating the need for a susceptor. The temperature of the substrate can therefore be changed very quickly. The heating system allows both the heat source and the plasma to face the substrate from opposite sides resulting in a more uniform layer thickness across the substrate.

In this manner epitaxial layers, of excellent quality, with extremely well defined abrupt junctions between layers or abrupt compositional differences at interfaces, can be defined. These compositional interfaces include the entire range of III-V semiconductor compositions.

BEST MODE OF CARRYING OUT THE INVENTION

Figure 1:
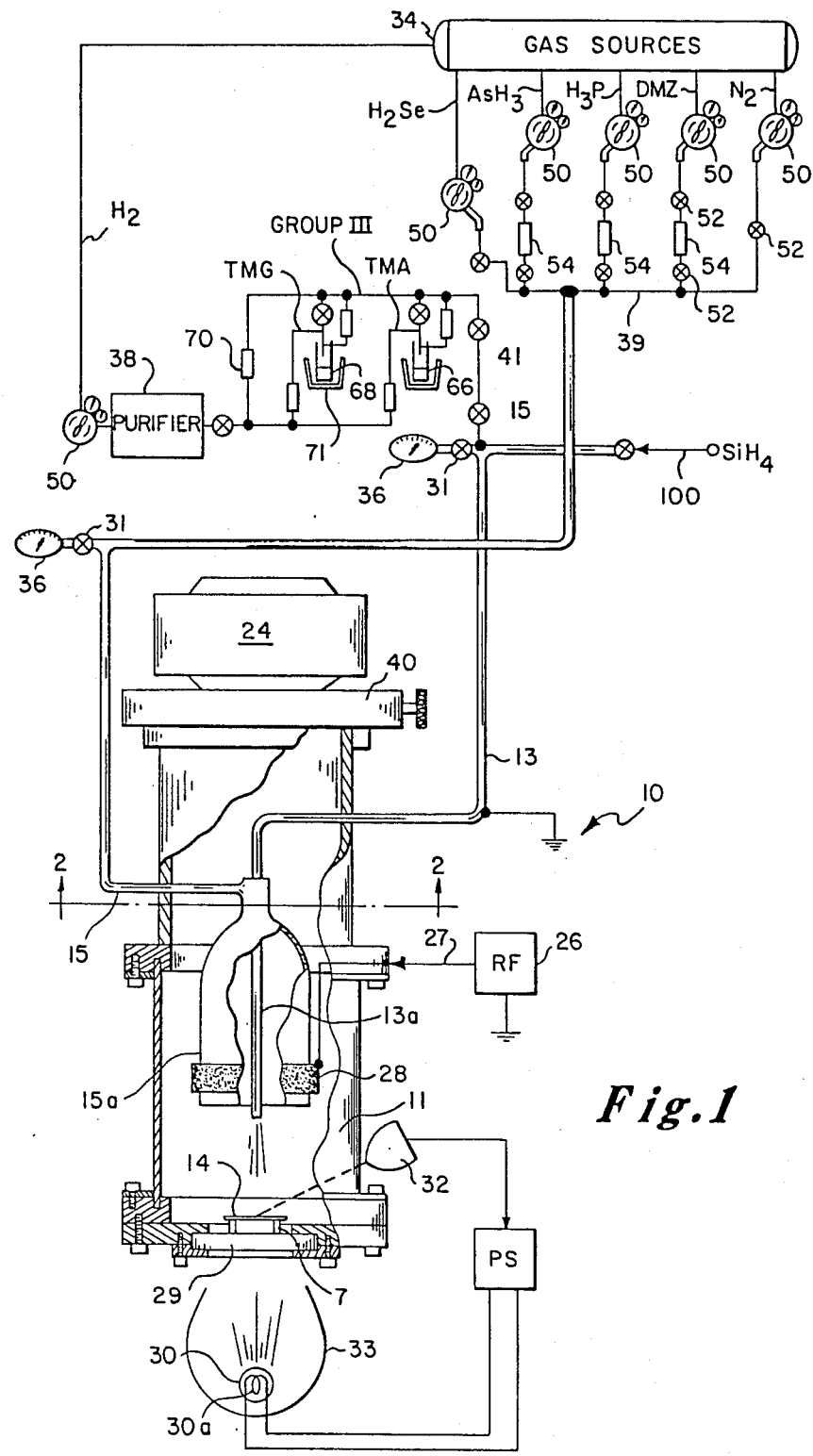
FIG. 1 is a schematic representation of a reaction chamber and accessory apparatus for practicing the method of the invention.

Referring now to FIG. 1 a preferred method of epitaxial growth in accordance with the invention will be described in connection therewith. A plasma enhanced CVD reaction chamber 10 is shown to comprise a vertical quartz envelope 11.

Figure 2:
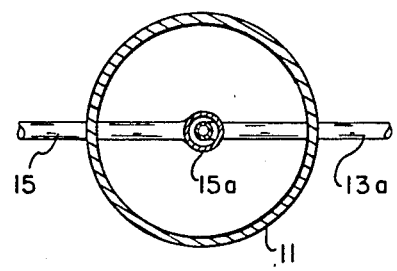
FIG. 2 is a cross-sectional view taken through lines II—II of FIG. 1.

The chamber 10 is divided into three concentric regions, shown in FIG. 2, to comprise an inner region defined by tube 13a, which extends from inlet tube 13, centrally down through the reactor 10; a middle region defined by tube 15, having a bell-shaped enlarged portion 15a concentric to tube 13a and an outer region defined by the space between the portion 15a and the inner walls of quartz envelope 11.

A metallic R.F. ring is provided around portion 15a and connected to R.F. generator through conductor 27. R.F. generator 26 produces 1 kW of R.F. energy at 13.56 MHz to generate a plasma in gaseous reactants in the region between the inner tube 13a and portion 15a. The pressure inside the chamber is held at about 100 milli-Torr (m Torr) by a turbomolecular vacuum pump 24. Pump 24 is coupled to one end of the chamber 10 via gate valve 40.

A source of heat is provided by light source 30 comprising lamps 30a mounted in front of a reflector 31 adjacent quartz window 29 at one end of the reactor. Light source 30 heats the substrate 14 from below. The substrate is mounted on quartz posts 7. An optical pyrometer 32 monitors the temperature of the substrate 14 and controls the lamp power supply 32 to maintain the substrate temperature at a predetermined level.

Optical heating is a simple and versatile method for heating the substrate 14 and has the advantage of allowing the substrate to be heated directly. Since no susceptor is required the heat capacity of the material which must be raised to the deposition temperature is minimized. Using this system, it is possible to heat the substrate to the growth temperature in less than 5 seconds. By heating the sample directly, a uniform temperature is maintained across the entire substrate and relatively little heat is transmitted to other parts of the reactor, thus minimizing sealing problems created by over-heating.

Reactant gases are provided from sources 34. The Group V gases may be connected by valves 50 and 52 to a single manifold 39 where the gases are mixed just prior to entering the reaction chamber. Group V constituent reactants such as arsine (AsH$_3$) or phosphine (PH$_3$) are regulated by mass flow controllers 54 and are injected into the manifold 39. The group III constituent (metal-organic compounds) reactants, such as trimethyl gallium (TMG) and trimethyl aluminum (TMA), are in liquid form in bubblers 66 and 68 respectively and enter the manifold 41 via an H$_2$ carrier gas which passes through a purifier 38 to the bubblers 68 containing the metal-organic sources. A mass flow controller 70 regulates the H$_2$ flow and a constant temperature bath 71 regulates the bubble temperature.

Dopants, such as H$_2$Se, n-type or dimethyl zinc (DMZ) p-type are introduced into the manifold 39 from sources 34 in a similar manner. Needle valves 31 and pressure gauge 36 located just before the reaction chamber are used to maintain the manifolds at atmospheric pressure. The exhaust is pumped out by pump 24 from the third region between envelope 11 and region 15a.

EXAMPLE 1

As an example of the method of the invention multiple epitaxial III-V layers of GaAs and AlGaAs may be grown using arsine AsH$_3$, trimethyl gallium (TMG), and trimethyl aluminum (TMA) as the reactant sources. A multilayered structure is grown by first establishing an arsine flow over a GaAs crystalline substrate at a low pressure of about 1 m Torr to 1 Torr. The arsine flow is established prior to heating to prevent substrate decomposition during the heating cycle. Next, the GaAs substrate is heated to about 425° C. using the heat source 30.

Next the TMG is introduced into the reactor while the substrate is maintained at the same temperature. No deposition occurs since at 425° C., insufficient thermal energy is available to change the reactant species at this temperature. Once the TMG flow has stabilized, a plasma is generated between ring 28 and tube 13a by energizing the RF source 26. The plasma can be confined to the region between ring 28 and the exit from tube 13a by varying reactor pressure and the position of ring 28. The energetic electrons which result from the plasma change the gas phase species of the reactants and reduces the thermal energy required for deposition. Thus, an epitaxial layer of GaAs begins to form on the substrate. When the desired layer thickness has been reached, the plasma is terminated by de-energizing RF source 26. A new set of reactants, such as AsH$_3$ for the As element, TMA for the Al element, and TMG for the Ga element, are established in the reactor and the plasma is generated again and AlGaAs deposits on the previous layer. The TMA:TMG ratio controls the composition of the AlGaAs layer deposited on the GaAs layer. The process can be repeated any number of times to produce multilayer GaAs structures. When the structure is completed the metalorganic sources are turned off, the temperature is reduced, and the arsine is turned off. The system is flushed with N$_2$, and the finished product is removed.

This CVD technique is very versatile in that it can be extended to other III-V systems by adding additional sources to the gas manifold. Abrupt p-n junctions in similar or identical materials can be formed by adding dopantcontaining gas reactants and adjusting the dopant flow, i.e. H$_2$Se for n-type, or DMZ for p-type.

EXAMPLE 2

Epitaxial layers of Si can be accomplished using SiH$_4$ as a gas reactant. The reactant (SiH$_4$) is introduced into the center tube 13a by conduit 100 at a low pressure of about 1 m Torr to 1 Torr. The minimum temperature required to decompose SiH$_4$ to yield a Si deposit is 550° C. The substrate 14, in this case an epitaxial Si wafer, is held at a temperature lower than 550° C., so that no Si deposition occurs. Next, an electric discharge is generated in the SiH$_4$ gas. Energy from the discharge drives the decomposition of the parent reactant to make possible the deposition of an epitaxial Si film. When the desired film thickness is reached, the discharge is terminated and the deposition stops. Dopant reactants, such as B$_2$H$_6$ (p-type) or PH$_3$ and/or AsH$_3$ (n-type) can be mixed with the SiH$_4$ to form alternate layers of p or n doped epitaxial Si in accordance with the above teaching.

EXAMPLE 3

Table I below lists the relevant growth parameters for various exemplary plasma ennanced depositions of the technologically important III-V semiconductors.

TABLE I

|   | Substrate | Epilayer | Reactants | Concentration | Substrate Temperature |
|---|---|---|---|---|---|
| S | GaAs | | | | |
| L1 | | GaAs | TMB + AsH$_3$ | 5 (V/III) | 425° C. |
| L2 | | Al$_x$Ga$_{1-x}$As (x < 0.35) | TMG + TMA + AsH$_3$ | 7 (V/III) | 425° C. |
| S | InP | | | | |
| L1 | | InP | TEI + PH$_3$ | | 475° C. |
| L2 | | In$_{0.53}$Ga$_{0.47}$As | TEI + TEG + AsH$_3$ | 50 (TEI/TEG) | 440° C. |
| L3 | | In$_x$GA$_{1-x}$As$_y$P$_{1-y}$ | TEI + TEG + AsH$_3$ + PH$_3$ | depends on x,y | 450° C. |
| S | GaP | | | | |
| L1 | | GaP | TMG + PH$_3$ | about 15 (V/III) | 500° C. |

S = Substrate
L1 = Layer 1
L2 = Layer 2
L3 = Layer 3

Figure 3:
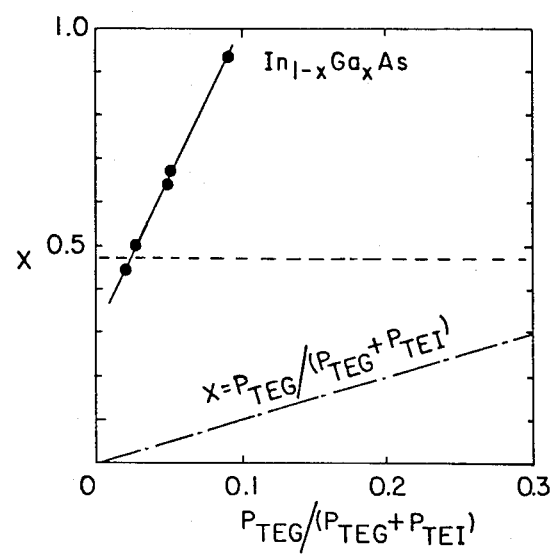
FIG. 3 is a plot of variation of crystal composition with reactant partial pressure.

In the MO CVD growth of a binary compound such as GaAs it has been found that the growth rate is controlled by the group III concentration. Stoichiometric crystals with good surface morphologies are obtained by maintaining a high concentration of the group V compound and then adjusting the group III concentration to achieve the desired growth rate. While material has been grown using V/III concentration ratios anywhere from 2–40, good device quality epilayers are typically grown with a ratio near 5. If a ternary or quaternary compound is desired the situation is much more cmmplex because now the crystal stoichiometry is controlled by the relative ratio of the group III or group V reactants. In the case of In$_{1-x}$Ga$_x$As, for example, the incorporation coefficient for Ga is much larger than for In. The graph in FIG. 3 taken from Ogura et al, *Japanese Journal of Applied Physics* 22(10) pg. 630, shows the TEI/TEG ratios which must be maintained to grow $In_{1-x}Ga_xAs$ of a desired composition. The crystal composition is seen to be very sensitive to the partial pressure of TEG. A similar situation exists with respect to the group V elements. To grow a quaternary compound with the composition $In_{0.79}Ga_{0.21}As_{0.47}P_{0.53}$ a $PH_3/AsH_3$ ratio of 10 should be maintained. (Razeghi et al, *Journal of Electronic Materials*, V 12, No. 2, p. 371 (1983).

In a plasma environment radicals are adsorbed on the substrate surface rather than molecules. Because these radicals are more reactive than the corresponding molecule their incorporation coefficients will be much nearer unity than that of the molecule. This results in reactant concentration ratios which are much nearer to the crystal composition allowing a much more controlled growth of the ternary and quaternary compounds than what is currently possible in the prior art methods.

EQUIVALENTS

This completes the description of the preferred embodiments of the invention. Many equivalents to the apparatus and method disclosed herein may be found by those skilled in the art, based upon the description provided herein. Accordingly, this invention is not to be limited except as provided in the following claims. For example, while the processes described herein generally refer to abruptly terminating deposition by stopping the electric discharge, it is also contemplated that some deposition may be allowed to continue, but at a greatly reduced rate.

We claim:

1. Apparatus for growing epitaxial layers on a substrate comprising:
   (a) a reaction chamber having an end wall with a light transparent window and a side wall with said substrate mounted parallel and adjacent to said window with one planar surface of said substrate exposed to said window;
   (b) first (metallic) tube means centrally disposed within and along a longitudinal axis of said chamber parallel to said side wall for introducing a first gaseous reactant into the chamber;
   (c) second (non-metallic) tube means disposed within said chamber concentric to said first tube means for introducing a second gaseous reactant into the chamber, the outer surface of said second tube means and the inner surface of said side wall forming a concentric symmetric exhaust region;
   (d) radiant heating means external to said reaction chamber for rapidly and directly heating the exposed surface of said substrate through said window to a temperature high enough to obtain epitaxial deposit from the first and second reactants when a decomposition reaction occurs between the reactants but low enough to prevent such decomposition from occurring;
   (e) pump means for exhausting gases from the location of the substrate out of said chamber in a first radially outward direction and then axially along the symmetric exhaust region in a direction opposite the flow of reactants through said first tube means;
   (f) means for generating a plasma between said first tube means and second tube means to impart sufficient energy to said reactants to result in decomposition for depositing an epitaxial layer on said substrate having an abrupt transition from substrate to layer; and
   (g) means for terminating said plasma when the layer is sufficiently thick.

2. Apparatus for growing epitaxial layers on a substrate comprising:
   (a) a reaction chamber having a side walled envelope, with an end wall having a light transparent window portion, and partitioned into three concentric regions symmetric about a longitudinal axis of said chamber by a first tube means and a second tube means, said regions comprising an inner control region, a middle region and an outer exhaust region;
   (b) said first tube means for introducing a first gaseous reactant into the inner control region defined by the inner volume of the first tube means, which first tube means extends to a reaction space opposite said window portions, wherein said substrate is adapted to be held with a major surface exposed to said window portion;
   (c) said second tube means concentric to said first tube means and also extending to said reaction space for introducing a second gaseous reactant into the middle region of said chamber, the space between said second tube means and said first tube means defining said middle region and the space between the second tube means and the envelope defining the outer region;
   (d) light means located outside said chamber for selectively and rapidly directly heating said major surface of said substrate to a temperature high enough to obtain epitaxial deposit on an opposite major surface of said substrate from the first and second reactants when a decomposition reaction occurs between the reactants;
   (e) means for monitoring the substrate temperature and controlling said light means to maintain the substrate temperature at a predetermined level;
   (f) plasma means for generating a plasma between said first tube means and second tube means to impart sufficient energy to said reactants to result in decomposition for depositing an epitaxial layer on said substrate having an abrupt transition from substrate to layer;
   (g) means for terminating said plasma when the layer is sufficiently thick; and
   (h) pump means for exhausting gasses out of said reaction space and axially through said exhaust region in a direction opposite the flow of reactants through said first tube means.

3. The apparatus of claim 2 wherein said second tube means is formed of non-conductive material and the plasma means comprises a metallic ring encircling said second tube means with said ring being coupled to an R.F. generator.

4. The apparatus of claim 3 wherein the second tube means has an enlarged bell-shaped portion where the metallic ring encircles it.

5. The apparatus of claim 4 wherein the substrate is mounted on posts and heated from below while the gaseous reactants are introduced vertically from above.

6. Apparatus for growing epitaxial layers on a substrate comprising:
   (a) a reaction chamber having an end wall with a light transparent window and a side wall, said substrate being disposed adjacent said window with an exposed first planar surface parallel to said window and wherein the epitaxial layers are formed on a second planar surface opposite the exposed surface;
(b) first tube means centnrally disposed within and along a longitudinal axis of said chamber extending to a reaction region adjacent said second planar surface for introducing a first gaseous reactant into the chamber;
(c) second tube means extending to a reaction region adjacent said second planar surface disposed within said chamber concentric to said first tube means for introducing a second gaseous reactant into the chamber, the outer surface of said second tube means and the inner surface of said side wall forming an exhaust region which is symmetric about said first and second tube means;
(d) radiant heating means external to said reaction chamber for rapidly and directly heating the first planar surface of said substrate through said window to a temperature high enough to obtain deposition on said substrate from the first and second reactants when a decomposition reaction occurs between the reactants;
(e) means for generating a plasma between said first tube means and second tube means;
(f) pump means for exhausting gasses from the location of the substrate out of said chamber in a first radially outward direction and then axially along the symmetric exhaust region in a direction opposite the flow of introduced reactants.

7. The apparatus of claim 6 including means for varying the location of the plasma generated in the region between said first tube means and said second tube means.

8. Apparatus for growing epitaxial layers on a substrate comprising:
(a) a reaction chamber having a vertical walled envelope and a bottom wall with a light transparent window, said chamber being partitioned into three concentric regions comprising an inner control region, a middle region and an outer exhaust region;
(b) a substrate holder for supporting a substrate at the periphery thereof with a major surface of said substrate disposed in a plane parallel to and adjacent said window;
(c) first tube means extending along a longitudinal axis of said chamber for introducing from above the holder a first gaseous reactant into said inner control region, said first tube means terminating at one end opposite said holder;
(d) second tube means concentric to said first tube means and terminating adjacent said substrate holder for introducing from above the holder a second gaseous reactant into the middle region of said chamber, the space between said second tube means and said first tube means defining said middle region and the space between the second tube means and the vertical walled envelope defining the outer exhaust region;
(e) light means disposed external to said chamber opposite said window for selectively and rapidly heating said substrate to bring the temperature of said substrate to a high enough temperature to obtain epitaxial deposit from the first and second reactants when a decomposition reaction occurs between the reactants;
(f) means for monitoring the substrate temperature and controlling said light means to maintain the substrate temperature at a predetermined level;
(g) plasma means for generating a plasma between said first tube means and said second tube means; and
(h) means for exhausting reactants by sweeping the introduced reactants radially outward from said inner and middle regions and axially out the outer exhaust region.

9. The apparatus of claim 8 wherein said second tube means is formed of non-conductive material and the plasma means comprises a metallic ring encircling said second tubes means with said ring being coupled to an R.F. generator.

10. The apparatus of claim 9 wherein the second tube means has an enlarged bell-shaped portion where the metallic ring encircles it.

* * * * *

UNITED STATES PATENT AND TRADEMARK OFFICE
CERTIFICATE OF CORRECTION

PATENT NO. : 4,773,355

DATED : Sep. 27, 1988

INVENTOR(S) : L. Rafael Reif, Clifton G. Fonstad, Jr. and Alan D. Huelsman

It is certified that error appears in the above—identified patent and that said Letters Patent is hereby corrected as shown below: Title page:

Alan D. Huelsman, Boston, Mass., is a co-inventor and should be listed as such by Item [75].

Col. 7, line 43, delete "(metallic)" and insert ---metallic---.

Col. 7, line 47, delete "(non-metallic)" and insert ---non-metallic---.

Col. 8, line 21, delete "portions" and insert ---portion---.

Col. 9, line 5, delete "centnrally" and insert ---centrally---.

Signed and Sealed this

Twenty-first Day of February, 1989

Attest:

DONALD J. QUIGG

*Attesting Officer*     *Commissioner of Patents and Trademarks*